(12) United States Patent
Hsu et al.

(10) Patent No.: US 9,337,573 B2
(45) Date of Patent: May 10, 2016

(54) ELECTRICAL CONNECTOR ASSEMBLY WITH JUMPER ELEMENT ASSEMBLED THEREON

(71) Applicant: HON HAI PRECISION INDUSTRY CO., LTD., New Taipei (TW)

(72) Inventors: Shuo-Hsiu Hsu, New Taipei (TW); Hao-Yun Ma, San Jose, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/320,892

(22) Filed: Jul. 1, 2014

(65) Prior Publication Data

US 2016/0006170 A1  Jan. 7, 2016

(51) Int. Cl.
 *H01R 3/00* (2006.01)
 *H01R 13/62* (2006.01)
 *H01R 13/518* (2006.01)

(52) U.S. Cl.
 CPC .............. *H01R 13/62* (2013.01); *H01R 13/518* (2013.01)

(58) Field of Classification Search
 CPC .. H01R 12/00; H01R 13/6275; H01R 13/639; H01R 13/62; H01R 13/6272–13/6277; H01R 13/20; H01R 13/4226; H01R 13/236; H01R 13/518
 USPC ............ 439/78, 366, 367, 83, 261, 298, 299, 439/308–312, 372, 832, 345, 484, 489, 352
 See application file for complete search history.

(56) References Cited

U.S. PATENT DOCUMENTS

| | | | | |
|---|---|---|---|---|
| 5,162,000 A * | 11/1992 | Frantz | .................... | 439/607.58 |
| 5,690,502 A * | 11/1997 | Mochizuki | .................... | 439/320 |
| 5,997,331 A * | 12/1999 | Tu | .................... | 439/328 |
| 6,042,411 A * | 3/2000 | Choy | .................... | 439/328 |
| 6,178,096 B1 * | 1/2001 | Flickinger et al. | ............ | 361/816 |
| 6,234,842 B1 * | 5/2001 | Keay et al. | ............... | 439/620.24 |
| 6,485,320 B1 * | 11/2002 | Ma | .................... | 439/342 |
| 6,767,907 B2 * | 7/2004 | Perregaard et al. | ...... | 514/253.11 |
| 6,830,464 B1 * | 12/2004 | Friend | .................... | 439/74 |
| 6,908,345 B2 * | 6/2005 | Shimizu et al. | ............... | 439/682 |
| 6,974,344 B2 * | 12/2005 | Comerci | .................... | 439/329 |

(Continued)

FOREIGN PATENT DOCUMENTS

TW          M429188         5/2012

OTHER PUBLICATIONS

Translation: TW M429188 Published May 11, 2012 Hon Hai, Hsu, Shuo Hsiu.*

*Primary Examiner* — Amy Cohen Johnson
*Assistant Examiner* — Milagros Jeancharles
(74) *Attorney, Agent, or Firm* — Wei Te Chung; Ming Chieh Chang

(57) ABSTRACT

An electrical connector assembly includes an insulating housing, a jumper element assembled in the insulating housing and a bracket located at the outside of the insulating housing. The insulating housing includes a pocket defining an opening. The bracket includes a retention portion extending into the pocket for retaining the jumper element into the pocket and a latch beside the opening of the pocket. The jumper element includes a protrusion engaging with the latch. The jumper element is assembled into the pocket in a vertical direction and can be pulled out through the opening in the horizontal direction with the latch sliding along the protrusion and finally disengaging the protrusion.

20 Claims, 6 Drawing Sheets

(56) References Cited

U.S. PATENT DOCUMENTS

| | | | |
|---|---|---|---|
| 7,112,102 B2* | 9/2006 | Masaki et al. | 439/682 |
| 7,517,229 B2* | 4/2009 | Ma | 439/73 |
| 7,654,829 B1* | 2/2010 | Chuang et al. | 439/67 |
| 7,828,585 B2* | 11/2010 | Kurimoto | 439/468 |
| 7,857,649 B2* | 12/2010 | Fan | 439/342 |
| 7,927,122 B2* | 4/2011 | Yamaji et al. | 439/342 |
| 8,043,114 B2* | 10/2011 | Kaneko et al. | 439/497 |
| 8,708,729 B2* | 4/2014 | An et al. | 439/331 |
| 9,048,569 B2* | 6/2015 | Chen | |
| 2011/0151708 A1* | 6/2011 | Kaneko et al. | 439/404 |
| 2011/0306229 A1* | 12/2011 | Katsui et al. | 439/345 |
| 2013/0143444 A1* | 6/2013 | Chen | 439/626 |
| 2014/0141628 A1* | 5/2014 | Hsu | 439/67 |

\* cited by examiner

ELECTRICAL CONNECTOR ASSEMBLY WITH JUMPER ELEMENT ASSEMBLED THEREON

BACKGROUND OF THE INVENTION

1. Field of the Invention

The present disclosure relates to an electrical connector assembly, and more particularly to an electrical connector assembly connecting a module with a printed circuit board (PCB), and having a jumper element assembled thereon.

2. Description of the Related Art

Various electrical connectors are widely used in computers and other electronic devices for establishing electrical connections between two electronic components, such as two packages, a package and a printed circuit board (PCB) and so on. An electrical connector for connecting a package typically comprises a socket defining an accommodating cavity for receiving the package. And with the development of technology, the electrical connector further comprises some pockets for receiving some small-size elements, such as lens assemblies, for optical communication. When removing the small-size elements, the user has to move the small-size elements manually by catching the small-size elements with fingers and then pull them out. However, with the miniaturized tendency of the electrical connector, the size of the electrical connector become smaller and smaller, so it is very difficult to pull the small-size elements out manually from a small pocket. More serious, the small-size elements or the electrical connector may be destroyed.

In view of the above, an improved electrical connector is desired to overcome the problems mentioned above.

SUMMARY OF THE INVENTION

Accordingly, an object of the present disclosure is to provide an electrical connector assembly with a jumper element and convenient removal of the jumper element.

In order to achieve the object set forth, an electrical connector assembly with a jumper element assembled thereon is provided. The electrical connector assembly comprises an insulating housing, a jumper element assembled in the insulating housing and a bracket located at the outside of the insulating housing. The insulating housing comprises a pocket defining an opening. The bracket comprises a retention portion extending into the pocket for retaining the jumper element into the pocket and a latch beside the opening of the pocket. The jumper element comprises a protrusion engaging with the latch. The jumper element is assembled into the pocket in a vertical direction and can be pulled out through the opening in a horizontal direction with the latch of the bracket sliding along the protrusion and finally disengaging the protrusion.

DESCRIPTION OF PREFERRED EMBODIMENT

Figure 1:
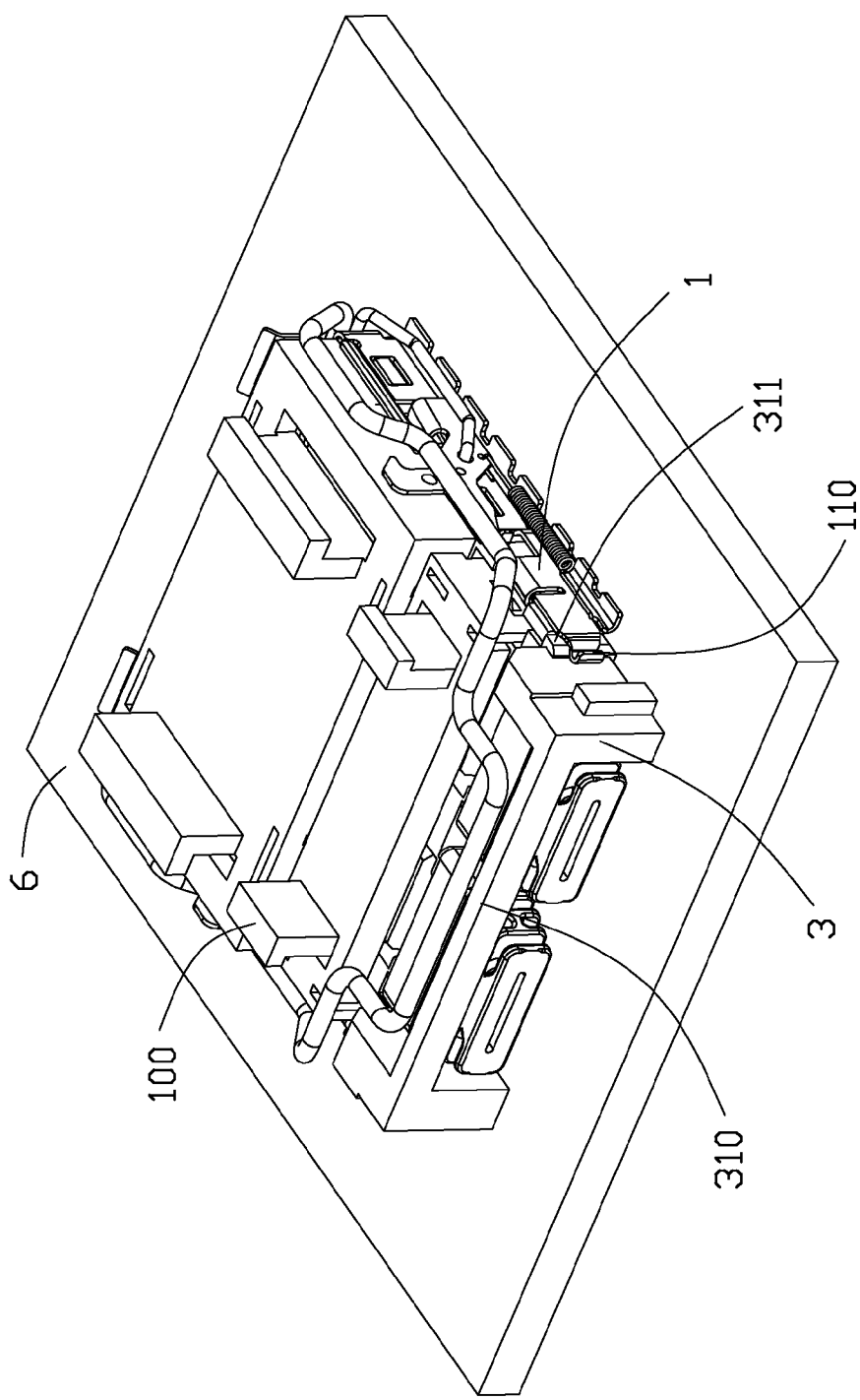
FIG. 1 is an assembled, perspective view of an electrical connector assembly in accordance with a preferred embodiment of the present disclosure.
Figure 2:
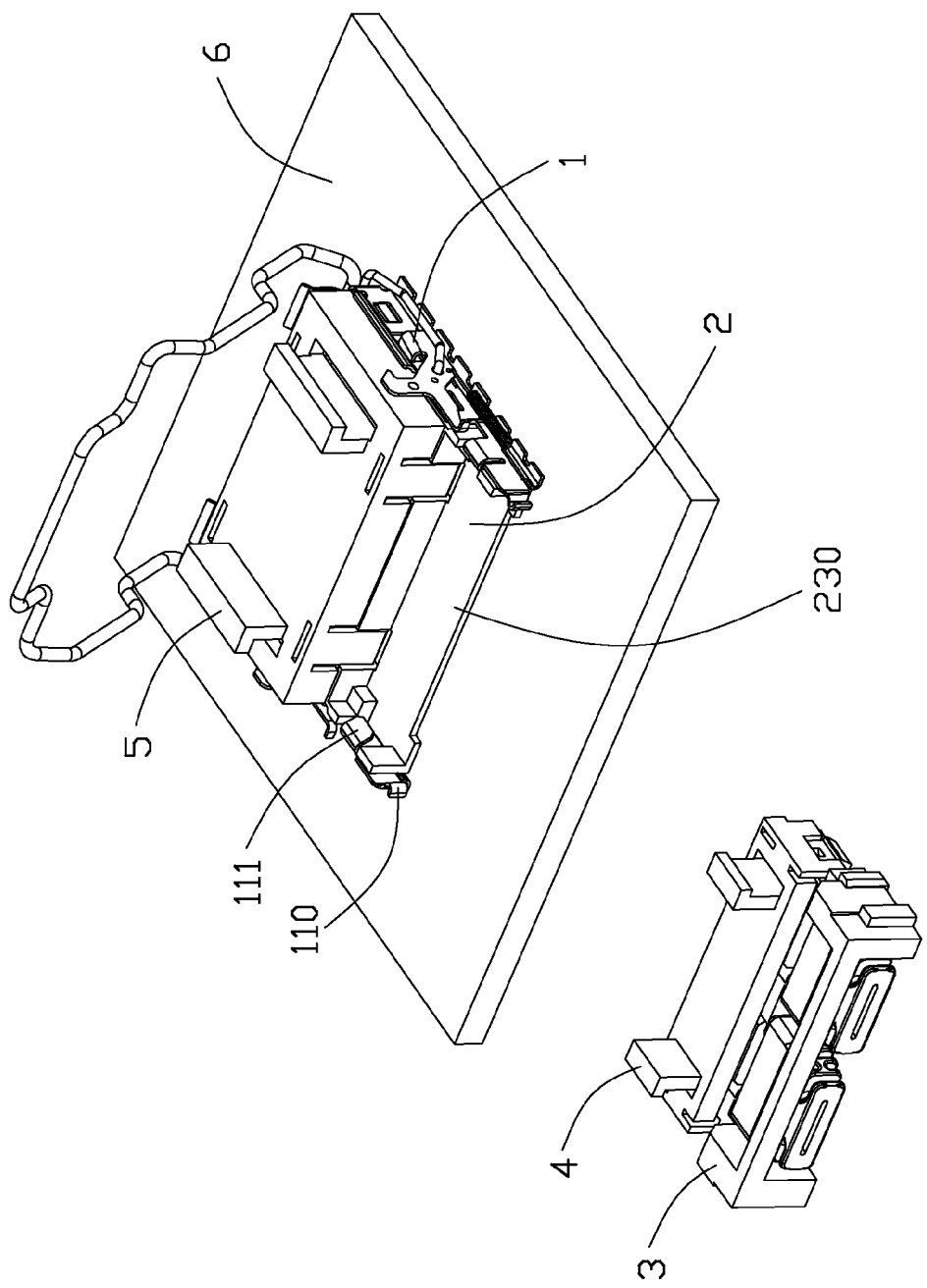
FIG. 2 is a schematic view of the electrical connector assembly shown in FIG. 1, wherein a jumper element is apart from the electrical connector.

Reference will now be made to the drawings to describe the present disclosure in detail.

Referring to FIGS. 1 to 5, an electrical connector assembly 100 for being assembled on a printed circuit board (PCB) 6 comprises an insulating housing 2, a plurality of contacts (not shown) received in the insulating housing 2, a bracket 1 surround the insulating housing 2, a jumper element 3 assembled onto the insulating housing 2, a first cap 4 assembled on the jumper element 3 and a second cap 5 assembled on the insulating housing 2.

Figure 3:
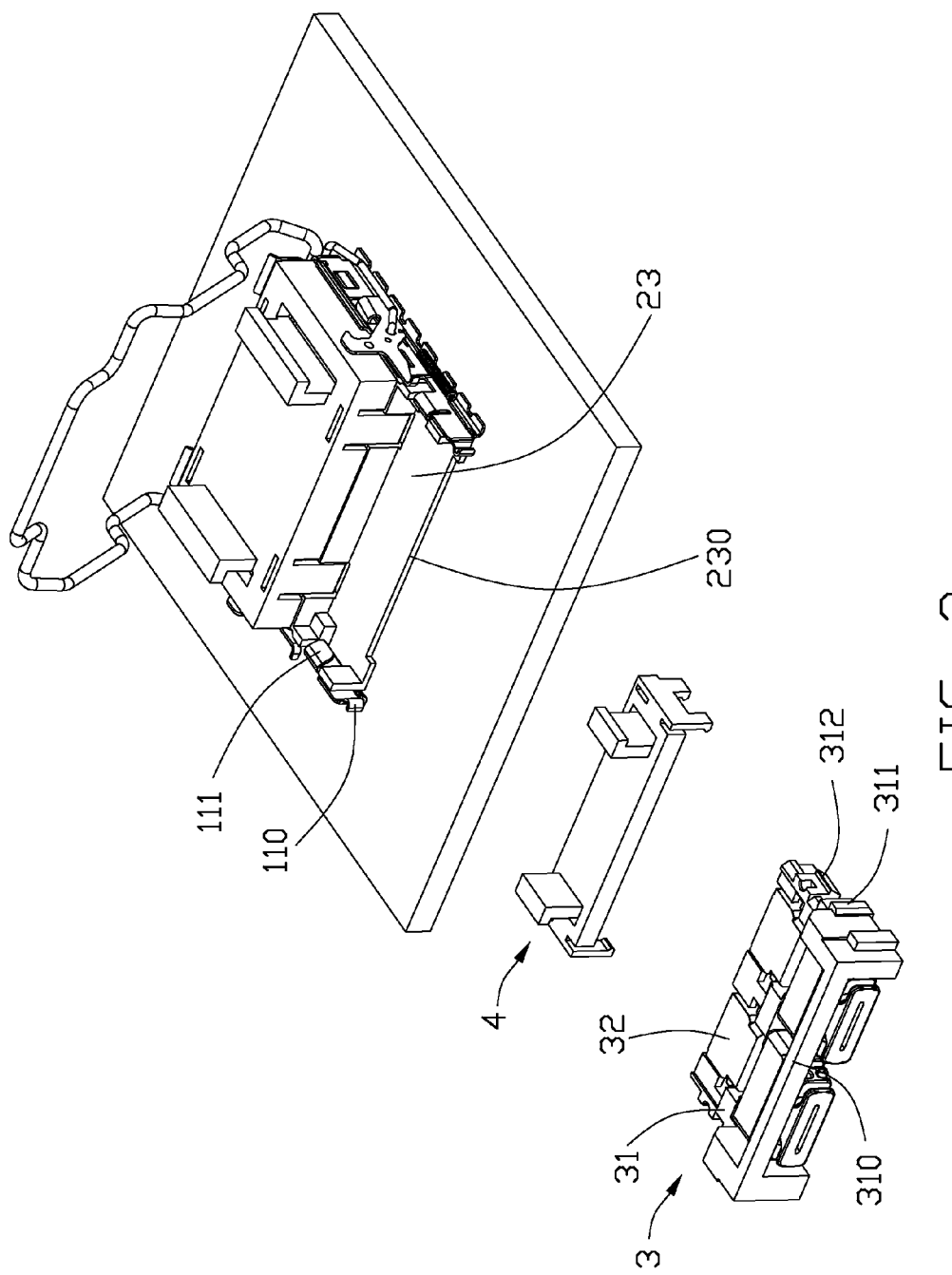
FIG. 3 is a similar view with FIG. 2, wherein a cap is apart from the jumper element.
Figure 4:
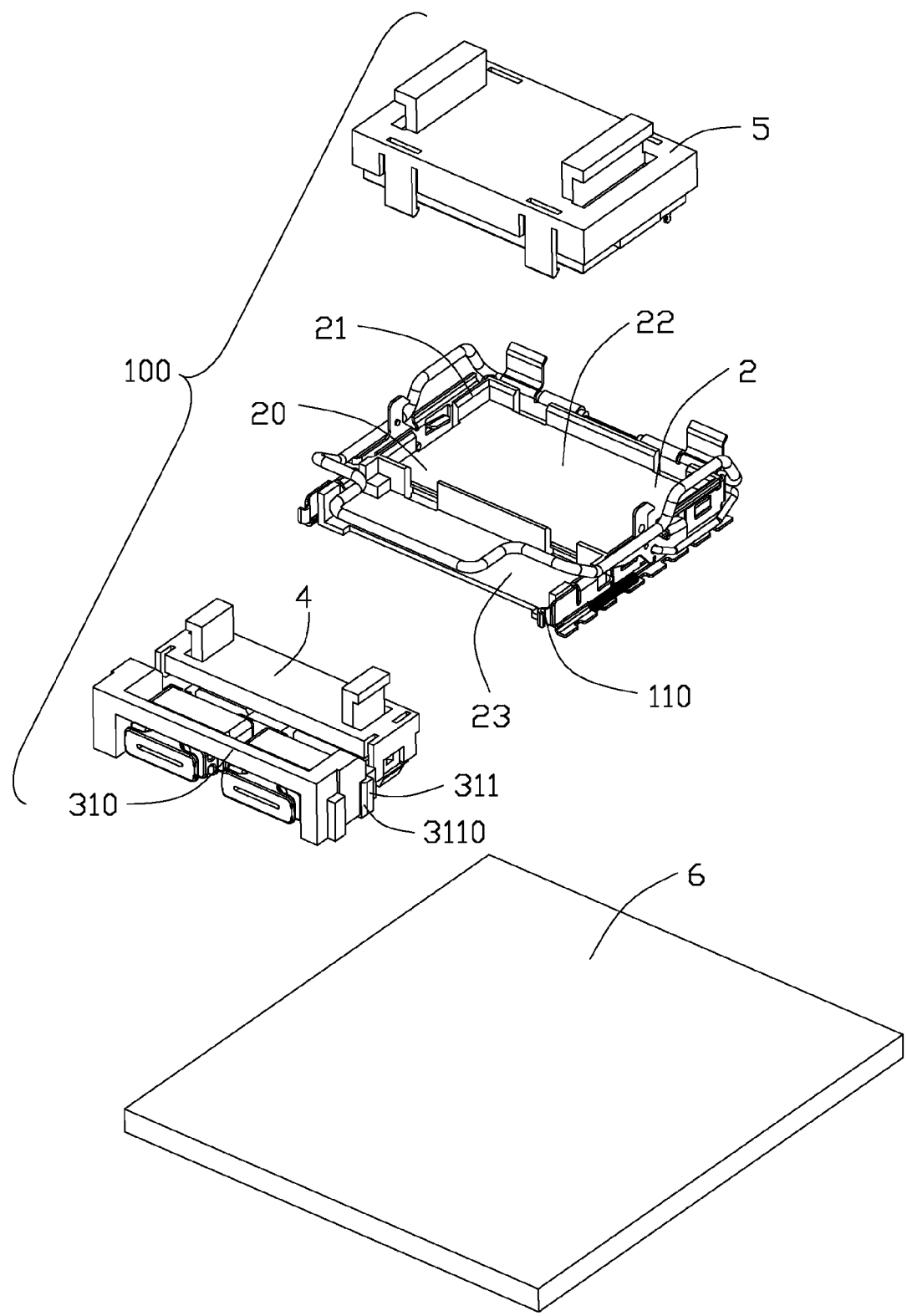
FIG. 4 is a schematic view of the electrical connector assembly shown in FIG. 1, wherein a bracket and an insulating housing are assembled together.

Referring to FIG. 3 and FIG. 4, the insulating housing 2 comprises a bottom wall 20 and a plurality of side walls 21. The bottom wall 20 and the side walls 21 define a cavity 22 and a pocket 23. The contacts are received in the insulating housing 2 and extend into the cavity 22 for electrically connecting a module. The pocket 23 locates beside the cavity 22 for receiving the jumper element 3 and comprises an opening 230 at a front end far from the cavity 22 for the jumper element 3 extending out.

Figure 6:
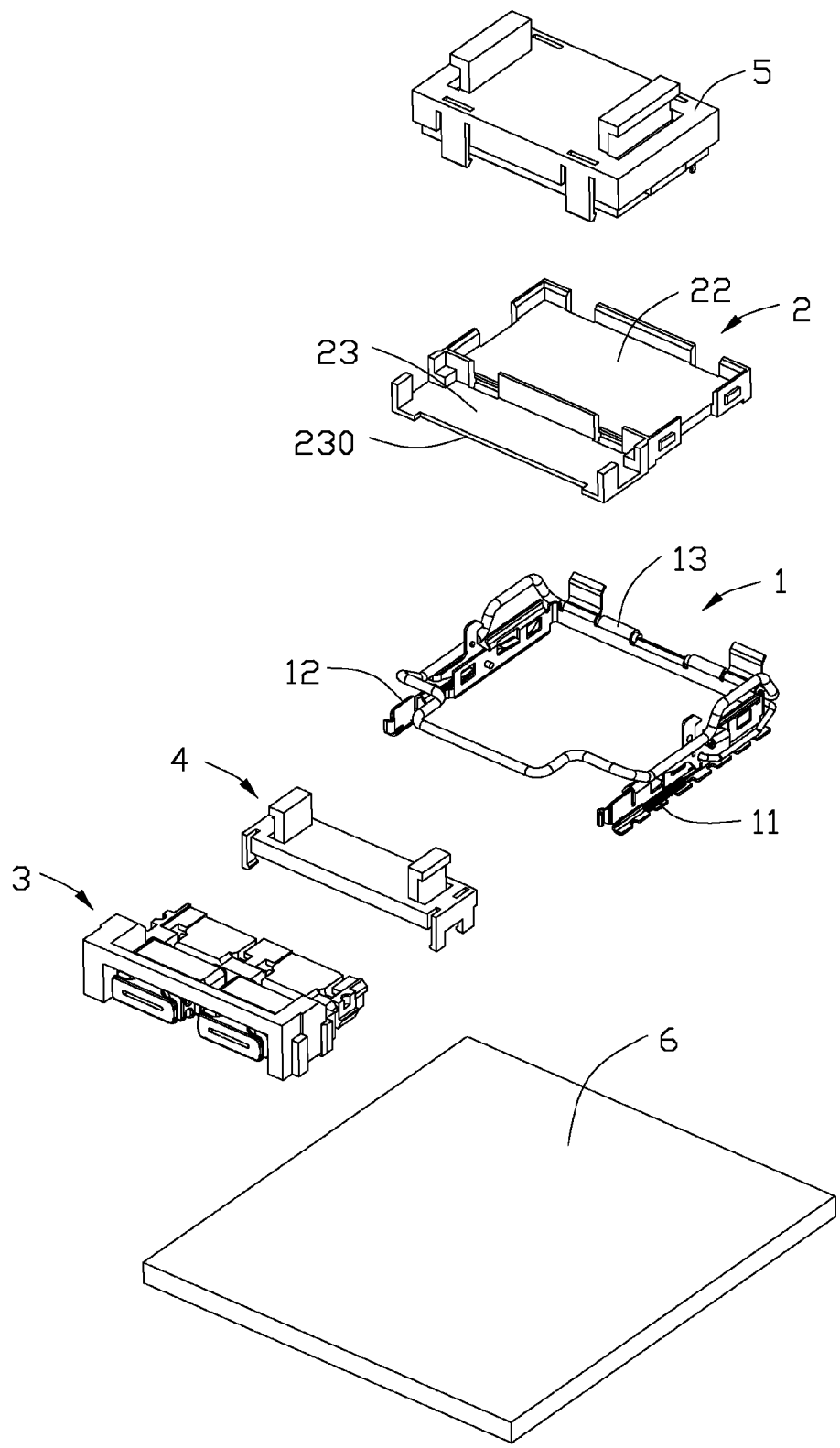
FIG. 6 is an exploded, perspective view of the electrical connector assembly shown in FIG. 1.

Referring to FIG. 6, the bracket 1 is a U-shaped metallic frame, comprising a first side 11, a second side 12 opposite to the first side 11 and a third side 13 connecting the first and second sides 11, 12. The third side 13 locates on a rear end opposite to the opening 230 of the pocket 23. Close to the front end opposite the rear end, each of the first and second sides 11, 12 comprises a latch 110 at two opposite sides of the opening 230, and a retention portion or latch section 111 extending towards the pocket 23. The latch 110 defines an arc-shaped surface for engaging the jumper element 3.

Figure 5:
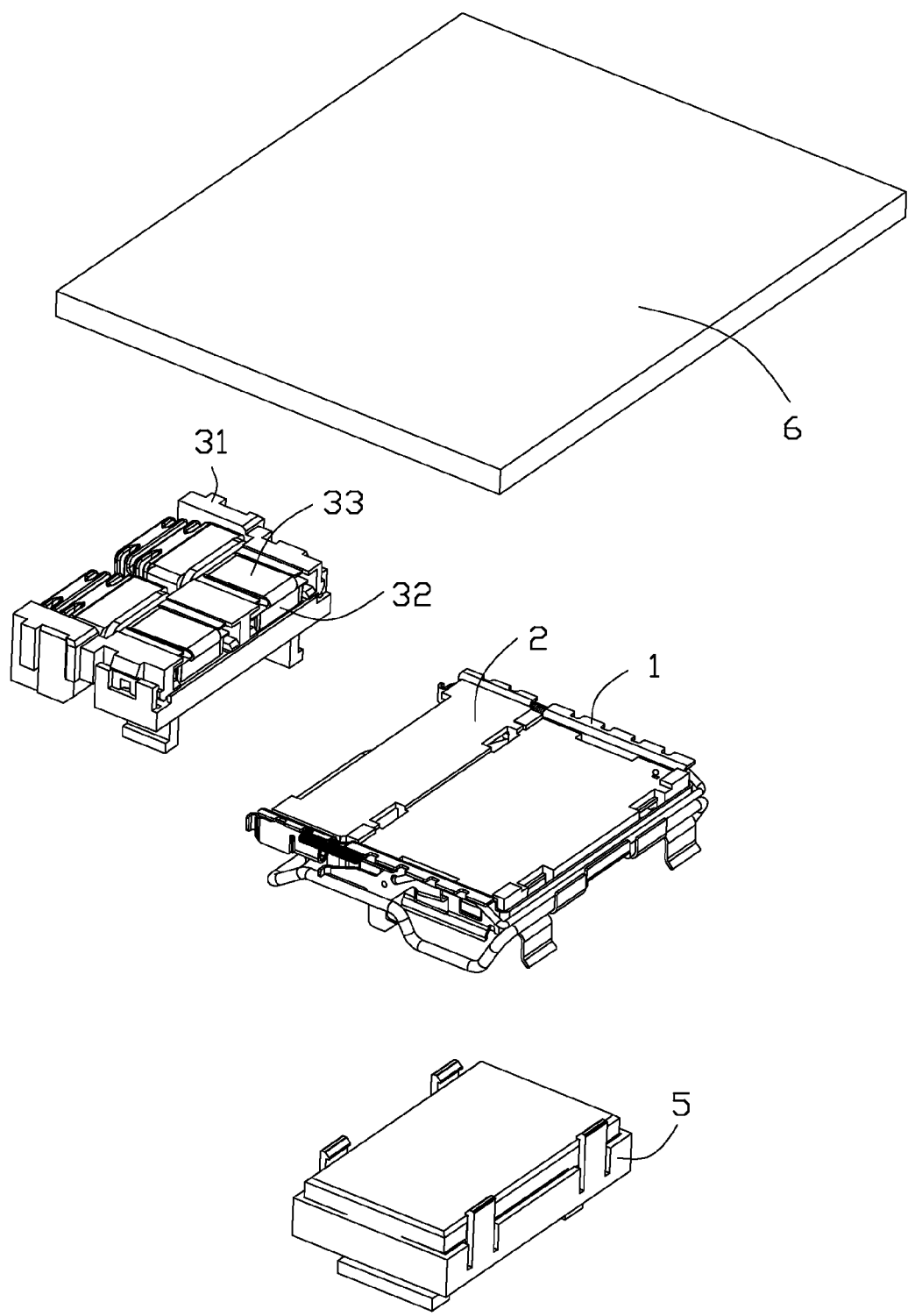
FIG. 5 is another view of the electrical connector assembly shown in FIG. 4.

Referring to FIGS. 3 to 5, the jumper element 3 comprises a seat 31 and two mating members 32 assembled onto the seat 31. The seat 31 comprises a pair of stepped portions or locking section 312 at two opposite ends for engaging with the retention portions 111 of the bracket 1 and a pair of protrusions 311 at two opposite ends and beside the stepped portions 312. The stepped portion 312 locates into the pocket 23 while the protrusion 311 locates beyond the pocket 23. Each of the protrusions 311 defines a chamfer 3110 at a side far away from the pocket 23 for guiding the jumper element 3 removals from the latch 110. The seat 31 comprises a lever 310 extending in a longitudinal direction for being grabbed by fingers. The seat 31 further comprises a pair of elastic members 33 insert-molded with the seat 31 for pushing the mating members 32.

When assembling, the mating member 32 and the seat 31 are assembled together forming the jumper element 3. The bracket 1 and the insulating housing 2 are assembled together with the retention portion 111 extending into the pocket 23 and the latches 110 located on two opposite of the opening 230 in the longitudinal direction. The jumper element 3 is assembled onto the pocket 23 in a vertical direction perpendicular to the longitudinal direction by the first cap 4. When the jumper element 3 moves downwardly, the retention portion 111 finally engages the stepped portion 312, thus, the jumper element 3 is retained thereon. At this time, the latch 110 engages the protrusion 311 of the jumper element 3, the arc-shaped surface abuts the chamfer 3110. When removing, firstly the first cap 4 is removed, then the user can grab the lever 310 and pull the jumper element 3 out from the pocket 23 in a horizontal direction perpendicular to both said longitudinal direction and vertical direction. The arc-shaped surface of the latch 110 slides along the chamfer 3110 and deforms elastically, and finally disengages the protrusion 311. Thus, the jumper element 3 is removed from the pocket 23 horizontally. The removal of the jumper member 3 becomes easy.

According to the above described embodiments, an electrical connector assembly 100 with a jumper element 3 assembled thereon is provided. The electrical connector assembly 100 comprises a pocket 23. The pocket 23 is a cubical space without a top wall and one of four side walls, i.e. the pocket 23 comprises an entrance facing a vertical direction and an exit (the opening 230) directly communicating the entrance and facing a horizontal direction perpendicular to the vertical direction. The jumper element 3 is assembled into the pocket 23 in the vertical direction from the entrance and removed from the pocket 23 in the horizontal direction from the exit which makes the assembling and removing of the jumper element 3 easy.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
   an insulating housing comprising a pocket defining an opening in a front end;
   a bracket located beside the insulating housing, the bracket comprising a retention portion extending into the pocket and a latch beside the opening of the pocket; and
   a jumper element assembled into the pocket, the jumper element comprising a protrusion corresponding to the latch; wherein
   the jumper element is assembled into the pocket in a vertical direction and restricted by the retention portion in the vertical direction, and the latch engages with the protrusion to provide a retention force in a horizontal direction perpendicular to said vertical direction, and wherein the jumper element can be pulled out through the opening in the horizontal direction with the latch sliding along the protrusion and finally disengaging the protrusion; wherein
   the jumper element is further equipped with a detachable cap rearwardly abutting against the retention portion in the horizontal direction so that the jumper element is able to be forwardly pulled out through the opening only after the cap is removed from the jumper element.

2. The electrical connector assembly as claimed in claim 1, wherein the protrusion comprises a chamfer at a side far away from the pocket, the latch comprises an arc-shaped surface abutting the chamfer.

3. The electrical connector assembly as claimed in claim 1, wherein the jumper element comprises a lever extending in a longitudinal direction perpendicular to both the vertical direction and the horizontal direction.

4. The electrical connector assembly as claimed in claim 1, wherein the jumper element comprises a stepped portion for engaging with the retention portion of the bracket.

5. The electrical connector assembly as claimed in claim 4, wherein the protrusion is located beside the stepped portion, the stepped portion locates into the pocket while the protrusion locates beyond the pocket.

6. The electrical connector assembly as claimed in claim 1, wherein the jumper element comprises a seat and a mating member assembled on the seat.

7. The electrical connector assembly as claimed in claim 6, wherein the seat comprises an elastic member elastically pushing the mating member.

8. The electrical connector assembly as claimed in claim 1, wherein the insulating housing comprises a cavity beside the pocket, a plurality of contacts is received in the insulating housing and extends into the cavity for electrically connecting a module.

9. The electrical connector assembly as claimed in claim 8, wherein the bracket is U-shaped, the bracket is open at the front end corresponding to the opening of the pocket.

10. An electrical connector assembly comprising:
    an insulating housing comprising a bottom wall and a plurality of side walls, the bottom wall and the side walls defining a pocket, the pocket comprising an entrance facing a vertical direction and an exit directly communicating the entrance and facing a horizontal direction perpendicular to the vertical direction; and
    a jumper element assembled into the pocket; wherein
    the jumper element is assembled thereon in the vertical direction from the entrance and removed in the horizontal direction from the exit; wherein
    the electrical connector assembly further comprises a first cap assembled on the jumper element, the first cap is removed in the vertical direction and is completely detached from the jumper element before the jumper element is removed in the horizontal direction.

11. The electrical connector assembly as claimed in claim 10, wherein the jumper element comprises a lever extending in a longitudinal direction perpendicular to both the vertical direction and the horizontal direction for operating by a user.

12. The electrical connector assembly as claimed in claim 10, wherein the electrical connector assembly further comprises a bracket surrounding the insulating housing, and wherein the bracket comprises a latch extending beside the exit while the jumper element comprises a protrusion engaging with the latch in the horizontal direction.

13. The electrical connector assembly as claimed in claim 12, wherein the jumper element comprises a stepped portion, the bracket comprises a retention portion extending into the pocket engaging the stepped portion to restrict the upward movement of the jumper element after assembled thereon.

14. An electrical connector assembly comprising:
    a housing forming a pocket defining an upward entrance upwardly communicating with an exterior in a vertical direction with a first latching section thereabouts, and a forward exit forwardly communicating with the exterior in a front-to-back direction perpendicular to said vertical direction with a second latching section thereabouts;
    a jumper element received in the pocket forming a first locking section interengaged with the first latching section, and a second locking section interengaged with the second latching section; wherein
    one of said first latching section and said first locking section is resilient to allow the jumper element to be downwardly assembled into the pocket through said entrance in the vertical direction; one of said second latching section and said second locking section is resilient to allow said jumper element to be forwardly removed from the pocket via said exit in the front-to-back direction; wherein
    said jumper element is further equipped with a cap configured to be detachably attached thereon; wherein
    said cap forms a holding portion for easily loading the jumper element into the pocket downwardly and detaching the cap upwardly from the jumper element completely.

15. The electrical connector assembly as claimed in claim 14, wherein the jumper element is allowed to be removed from the pocket forwardly only after the cap has been removed therefrom.

16. The electrical connector assembly as claimed in claim 15, wherein the cap includes a portion rearwardly abutting against the first latching section in the front-to-back direction for not allowing said cap and the associated jumper element to move forwardly.

17. The electrical connector assembly as claimed in claim 14, wherein the second latching section and the second locking section are configured to only allow the jumper element to be removed from the pocket forwardly in the front-to-back direction via said exit, and prohibit the jumper element from entering the pocket rearwardly in the front-to-back direction via said exit.

18. The electrical connector assembly as claimed in claim 14, wherein said first latching section and said second latching section are resilient while the first locking section and the second locking section are stiff.

19. The electrical connector assembly as claimed in claim 1, wherein said cap is completely removed from the jumper element in the vertical direction.

20. The electrical connector assembly as claimed in claim 15, wherein said cap is completely removed from the jumper element in the vertical direction.

* * * * *